US012593564B2

(12) United States Patent
Park

(10) Patent No.: US 12,593,564 B2
(45) Date of Patent: Mar. 31, 2026

(54) DISPLAY APPARATUS AND METHOD FOR MANUFACTURING THE SAME

(71) Applicant: LG Display Co., Ltd., Seoul (KR)

(72) Inventor: Chanhyeok Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 573 days.

(21) Appl. No.: 17/992,851

(22) Filed: Nov. 22, 2022

(65) Prior Publication Data

US 2023/0189563 A1     Jun. 15, 2023

(30) Foreign Application Priority Data

Dec. 13, 2021     (KR) ........................ 10-2021-0177847

(51) Int. Cl.
H10K 50/87 (2023.01)
H05K 7/20 (2006.01)
H10K 71/00 (2023.01)

(52) U.S. Cl.
CPC ......... H10K 50/87 (2023.02); H05K 7/20963 (2013.01); H10K 71/00 (2023.02)

(58) Field of Classification Search
CPC ...... H10K 50/87; H10K 71/00; H10K 50/841; H05K 7/20963; H05K 1/028; H05K 1/116; G06F 1/1637; G06F 1/203; G06F 1/1626; G09F 9/301; G09F 9/33; G09F 9/335; B22F 7/004
See application file for complete search history.

(56) References Cited

U.S. PATENT DOCUMENTS

| | | | |
|---|---|---|---|
| 10,915,151 B2 | 2/2021 | Silvanto et al. |
| 11,107,743 B2 | 8/2021 | Hwang et al. |
| 11,355,413 B2 | 6/2022 | Lee et al. |
| 11,360,518 B2 | 6/2022 | Shin et al. |

(Continued)

FOREIGN PATENT DOCUMENTS

| | | |
|---|---|---|
| CN | 109524434 A | 3/2019 |
| CN | 109860240 A | 6/2019 |

(Continued)

OTHER PUBLICATIONS

Korean Intellectual Property Office, Office Action, Korean Patent Application No. 10-2021-0177847, Dec. 6, 2024, 12 pages.

(Continued)

*Primary Examiner* — J. E. Schoenholtz
(74) *Attorney, Agent, or Firm* — Fenwick & West LLP

(57) ABSTRACT

A display apparatus includes a glass substrate and having improved heat-dissipation function and impact absorption function and at the same time, having a reduced thickness. To this end, a plate including a porous member having both a heat-dissipation function and an impact absorption function is disposed under a display panel. The plate can have both a heat-dissipation function and a cushion function with only a porous member without adding a separate heat-dissipation layer or cushion layer. Further, disclosed is a display apparatus in which a black screen is displayed while the display panel is not activated, thereby improving display quality. To this end, a black heat-dissipation layer is formed under the porous member such that the heat-dissipation performance and the display quality are improved.

15 Claims, 6 Drawing Sheets

(56)　　　　　References Cited

U.S. PATENT DOCUMENTS

| | | | |
|---|---|---|---|
| 2018/0151641 A1* | 5/2018 | Choo | G06V 40/1306 |
| 2019/0246518 A1 | 8/2019 | Shen et al. | |
| 2020/0176705 A1 | 6/2020 | Lee et al. | |
| 2020/0192433 A1 | 6/2020 | Shin et al. | |
| 2020/0211920 A1 | 7/2020 | Lee et al. | |
| 2020/0303276 A1 | 9/2020 | Hwang et al. | |
| 2021/0150177 A1 | 5/2021 | Park et al. | |
| 2021/0151541 A1 | 5/2021 | Lim et al. | |
| 2021/0191552 A1* | 6/2021 | Bok | H10K 59/38 |
| 2021/0288282 A1 | 9/2021 | Kim et al. | |
| 2021/0407340 A1* | 12/2021 | Wang | G09F 9/301 |
| 2022/0029129 A1* | 1/2022 | Lee | H10K 77/111 |
| 2022/0166082 A1 | 5/2022 | Wang et al. | |
| 2022/0312654 A1 | 9/2022 | Zhang et al. | |
| 2022/0394860 A1 | 12/2022 | Park et al. | |
| 2023/0105026 A1 | 4/2023 | Park | |
| 2023/0269962 A1* | 8/2023 | Bae | H10K 50/00 |
| | | | 257/40 |
| 2023/0354682 A1* | 11/2023 | Hu | H05K 7/20963 |

FOREIGN PATENT DOCUMENTS

| | | | |
|---|---|---|---|
| CN | 111564677 A | 8/2020 | |
| CN | 112820208 A | 5/2021 | |
| CN | 115955879 A | 4/2023 | |
| DE | 102022112489 A1 | 12/2022 | |
| EP | 4020073 A1 | 6/2022 | |
| EP | 4020074 A1 | 6/2022 | |
| KR | 10-2015-0106273 A | 9/2015 | |
| KR | 10-1910561 B1 | 10/2018 | |
| KR | 10-2020-0073085 A | 6/2020 | |
| KR | 10-2020-0083697 A | 7/2020 | |
| KR | 10-2020-0112068 A | 10/2020 | |
| KR | 10-2021-0060734 A | 5/2021 | |
| WO | WO 2021/227712 A1 | 11/2021 | |

OTHER PUBLICATIONS

German Patent and Trademark Office, Office Action, German Patent Application No. 102022130494.9, Apr. 18, 2023, eight pages.

Intellectual Property Office of the United Kingdom, Combined Search and Examination Report, United Kingdom Patent Application No. GB2216495.8, May 26, 2023, 10 pages.

China National Intellectual Property Administration, Office Action, Chinese Patent Application No. 202211548595.5, Jun. 26, 2025, 21 pages.

China National Intellectual Property Administration, Office Action, Chinese Patent Application No. 202211548595.5, Nov. 1, 2025, 22 pages.

* cited by examiner

DISPLAY APPARATUS AND METHOD FOR MANUFACTURING THE SAME

CROSS-REFERENCE TO RELATED APPLICATION

This application claims priority to and benefit of Republic of Korea Patent Application No. 10-2021-0177847 filed on Dec. 13, 2021, which is hereby incorporated by reference as when fully set forth herein.

BACKGROUND

Field

The present disclosure relates to a display apparatus and a manufacturing method thereof, and more specifically, to provide a display apparatus and a manufacturing method thereof capable of improving heat-dissipation and impact absorption functions while reducing a thickness of the display apparatus, and improving display quality of the display apparatus.

Description of Related Art

A display apparatus that displays an image on a TV, a monitor, a smart phone, a tablet PC, a laptop computer, and the like is used in various manners and forms.

Subsequent to a liquid crystal display (LCD) apparatus that has been used up to now among the display apparatuses, use and application ranges of an organic light-emitting display (OLED) apparatus are rapidly expanding.

The display apparatus includes a liquid crystal or a light-emitting element to realize the image, and includes a thin-film transistor for individually controlling an operation of each liquid crystal or light-emitting element.

For example, an organic light-emitting display apparatus includes a driving thin-film transistor for driving a pixel and a light-emitting element that generates light upon receiving a signal from the driving thin-film transistor.

The organic light-emitting display apparatus is thin and light, and have advantages such as low power consumption, high luminance, and fast response.

The organic light-emitting display apparatus may include a substrate made of a plastic material or a glass material. When the plastic substrate is used, the substrate is thin and flexible, and is widely used in a flexible display apparatus that may be bent and folded.

Moreover, the glass substrate has a flat surface and has a certain level of strength and hardness, a driving thin-film transistor and a light-emitting element may be easily formed on the glass substrate.

The small organic light-emitting display apparatus is widely used in a smartphone. The plastic substrate is widely used in flexible and foldable display apparatuses.

Moreover, a medium and large sized organic light-emitting display apparatus has a larger area than that of the small organic light-emitting display apparatus, and requires the larger number of driving circuits and pixels.

Therefore, the driving circuit and the pixels are complicatedly disposed. Thus, a precise process for forming the driving circuit and the pixels is required. For this purpose, the glass substrate in which a flatness may be continuously maintained is widely used.

SUMMARY

A display apparatus using a glass substrate may be heavier and thicker than a display apparatus using a plastic substrate is and may be easily damaged due to external impact.

Further, as an area of a display panel increases and a high resolution is applied, an output range of a driver for driving the pixels is widened and a driving speed thereof is increased, such that power consumption of the driver and the display panel increases. Thus, a lot of high-temperature heat is generated therefrom.

Accordingly, a reinforcing member for absorbing external impact applied to the display panel or for reinforcing strength of the display panel, and a heat-dissipation member for removing the high-temperature heat generated from the display apparatus are provided in a stack manner of a plurality of layers. Thus, a weight and a thickness of the display apparatus are further increased.

For example, the reinforcing member may include a reinforcing layer made of polyethylene terephthalate (PET), polyimide (PI), etc. and disposed under the display panel. The heat-dissipation member may include a metal layer or metal plate made of a metal having high thermal conductivity such as copper (Cu) and aluminum (Al) and disposed under the display panel or the reinforcing member.

As a thickness of each of the reinforcing member and the heat-dissipation member increases, a reinforcing function and a heat-dissipation function of the display apparatus may increase. However, the overall thickness and weight of the display apparatus increase by the thickness increases. This may be disadvantageous in terms of portability and design.

Further, when the thickness of each of the heat-dissipation layer and the cushion layer is reduced to reduce the overall thickness of the display apparatus, the heat-dissipation function and the impact absorption function may be reduced.

Moreover, the reinforcing member and the heat-dissipation member having different functions may be made of different materials suitable for different functions. Thus, an interlayer separation phenomenon or poor adhesion may occur between the layers made of the different materials. In order to fix the layers to each other, it is necessary to add a separate adhesive layer between the layers and perform an adhering process. Thus, a manufacturing cost may increase along with the increase in the thickness.

A purpose of the present disclosure is to improve the heat-dissipation function and reinforcing function (or impact absorption function) of a display apparatus using a glass substrate while reducing a thickness and a weight of the display apparatus, and to simplify a manufacturing process thereof.

Purposes of the present disclosure are not limited to the above-mentioned purpose. Other purposes and advantages of the present disclosure that are not mentioned may be understood based on following descriptions, and may be more clearly understood based on embodiments of the present disclosure. Further, it will be easily understood that the purposes and advantages of the present disclosure may be realized using means shown in the claims and combinations thereof.

A display apparatus according to an embodiment of the present disclosure includes a display panel including a front portion on which an image is displayed and a pad portion extending from the front portion; and a plate in contact with a bottom surface of the front portion, wherein the plate may include a porous member and an adhesive member positioned on the porous member.

Moreover, a substrate of the display panel may include a glass substrate. At least one of a first heat-dissipation layer and a second heat-dissipation layer may be formed under the display panel.

A display apparatus according to another embodiment of the present disclosure includes a display panel including a substrate including glass and a pixel array for displaying an image. The pixel array may be disposed on the substrate. The display apparatus may also include a plate disposed below the display panel. The plate includes a porous member including a metal structure formed with a plurality of pores and an adhesive member on a top surface of the porous member.

The specific details of other embodiments are included in the detailed description and drawings.

The plate according to the present disclosure includes a porous member having both a heat-dissipation function and a cushion function. Thus, it is possible to obtain an effective heat-dissipation function and a reinforcing function (or an impact absorption function) only with the porous member.

The porous member has very good heat-dissipation function and reinforcing function (or impact absorption function) even at a small thickness thereof. This may reduce an overall thickness of the plate, thereby reducing an overall thickness and weight of the display apparatus.

Further, a black heat-dissipation layer is formed on the bottom surface of the plate according to the present disclosure, and further improves the heat-dissipation function. Due to the black heat-dissipation layer, a screen is displayed in black while the display panel is not activated. This improves display quality.

Effects of the present disclosure are not limited to the above-mentioned effects, and other effects as not mentioned will be clearly understood by those skilled in the art from following descriptions.

DETAILED DESCRIPTION

Figure 1A:
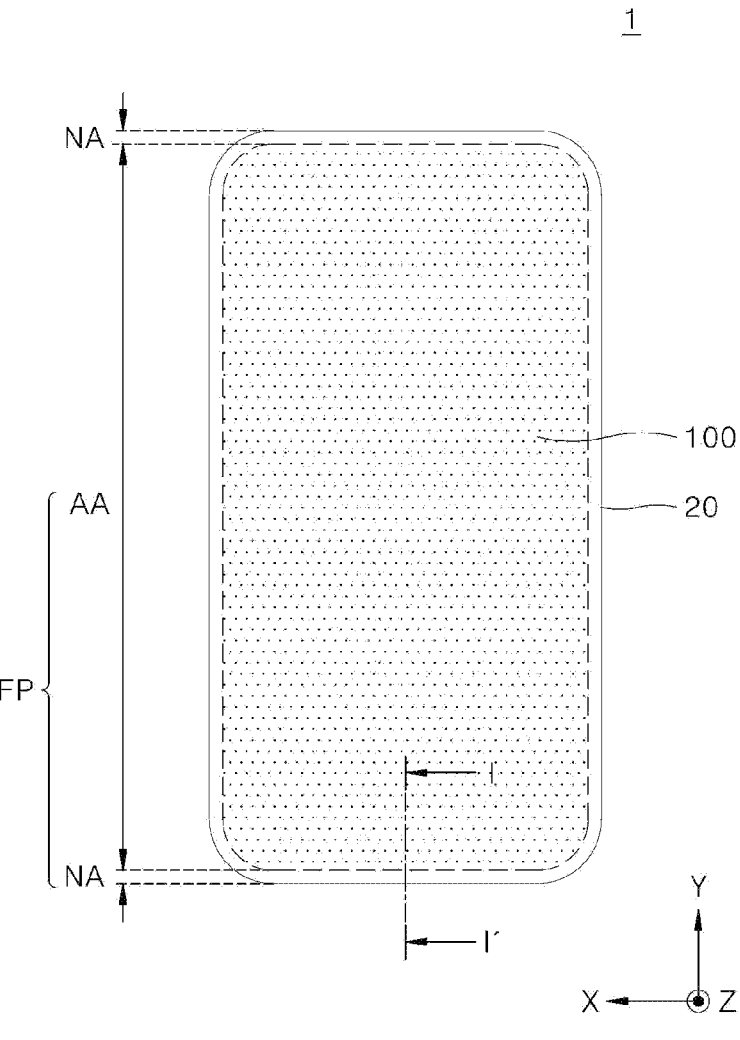
FIG. 1A and FIG. 1B show a front surface and a back surface of a display apparatus according to an embodiment of the present disclosure, respectively.

Advantages and features of the present disclosure, and a method of achieving the Advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the disclosure to those of ordinary skill in the technical field to which the present disclosure belongs.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

As used herein, the term "substantially," "about," and similar terms are used as terms of approximation, and are intended to account for inherent deviations in measured or calculated values that would be recognized by those of ordinary skill in the art. The term may be used to prevent unauthorized exploitation by an unauthorized infringer to design around accurate or absolute figures provided to help understand the present disclosure.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, a top or upward direction may refer to a +Z-axis direction, and a bottom or downward direction may refer to a −Z-axis direction.

Moreover, in a plan view of a display apparatus, an upper side surface or an upper side, a lower side surface or a lower side, a left side surface or a left side, and a right side surface or a right side may be defined on a plane defined by X-axis and Y-axis directions perpendicular to the Z axis direction.

A display apparatus of the present disclosure may be applied to an organic light-emitting display apparatus, but may not be limited thereto, and may be applied to various display apparatuses such as an LED display apparatus or a quantum dot display apparatus.

Hereinafter, various configurations of a display apparatuses which may improve the heat-dissipation performance and the reinforcing function (or impact absorption function) of the device while reducing a thickness and weight of the device, and may have improved display quality will be described.

Figure 1B:
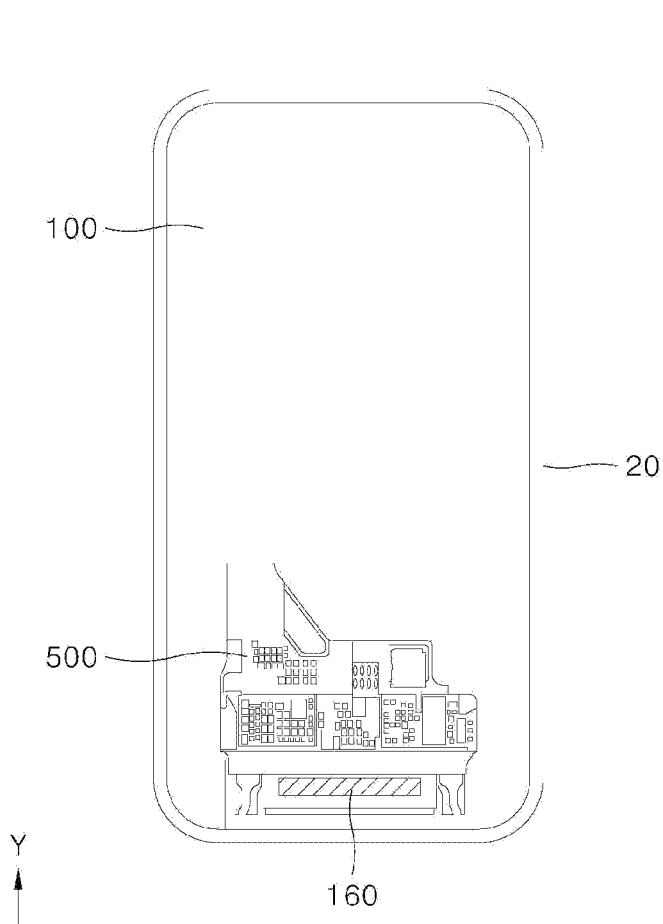

FIG. 1A shows a front surface where a display area is located in a display apparatus, and FIG. 1B shows a back surface of the display apparatus.

A display apparatus 10 may include a cover member 20, a display panel 100 coupled to a back surface of the cover member 20, and a frame disposed on a back surface of the display panel 100 so as to support the cover member 20. The display panel 100 may be disposed between the cover member 20 and the frame.

The cover member 20 is disposed to cover the front surface of the display panel 100 to protect the display panel 100 from external impact. The cover member 20 may be made of cover glass, tempered glass, and reinforced plastic, and the like. The present disclosure is not limited thereto.

An edge portion of the cover member 20 may have a curved portion bent toward a back surface (in a −Z axis direction) of the display apparatus 10.

In this case, the cover member 20 is disposed to cover at least a partial area of a side surface of the display panel 100 disposed on the back surface thereof, so that not only the front surface of the display panel 100 but also the side surface thereof may be protected from external impact.

The cover member 20 may be made of a transparent material so that the cover member may overlap with a display area of the display panel for displaying an image. For example, the cover member 20 may be made of a transparent plastic material or a cover glass made of a transparent glass material that may transmit an image therethrough. The present disclosure is not limited thereto.

The display panel 100 including a front portion FP and a pad portion PAD may be disposed under the cover member 20. The front portion FP may include a pixel array including a plurality of light-emitting elements, pixels having driving thin-film transistors, and signal lines for transmitting a drive signal so as to display an image. The front portion FP may include a display area AA on which an image is displayed and a non-display area NA that is an area other than display area AA. The non-display area NA may be formed to surround the display area AA.

The display area AA and the non-display area NA may be equally applied to the cover member 20. An area of the cover member 20 through which the image transmits may be a display area AA of the cover member. An area of the cover member which surrounds the display area AA and through which the image does not transmit may be a non-display area NA of the cover member. The non-display area NA may be a bezel area.

The pad portion PAD of the display panel 100 extends from the front portion FP, and a driver for driving a pixel may be directly connected to the pad portion PAD. Alternatively, a flexible circuit board 400 on which the driver 420 has been mounted may be connected to the pad portion PAD.

Hereinafter, the display panel 100 and a plate 200 according to an embodiment of the present disclosure will be described with reference to FIG. 2.

Figure 2:
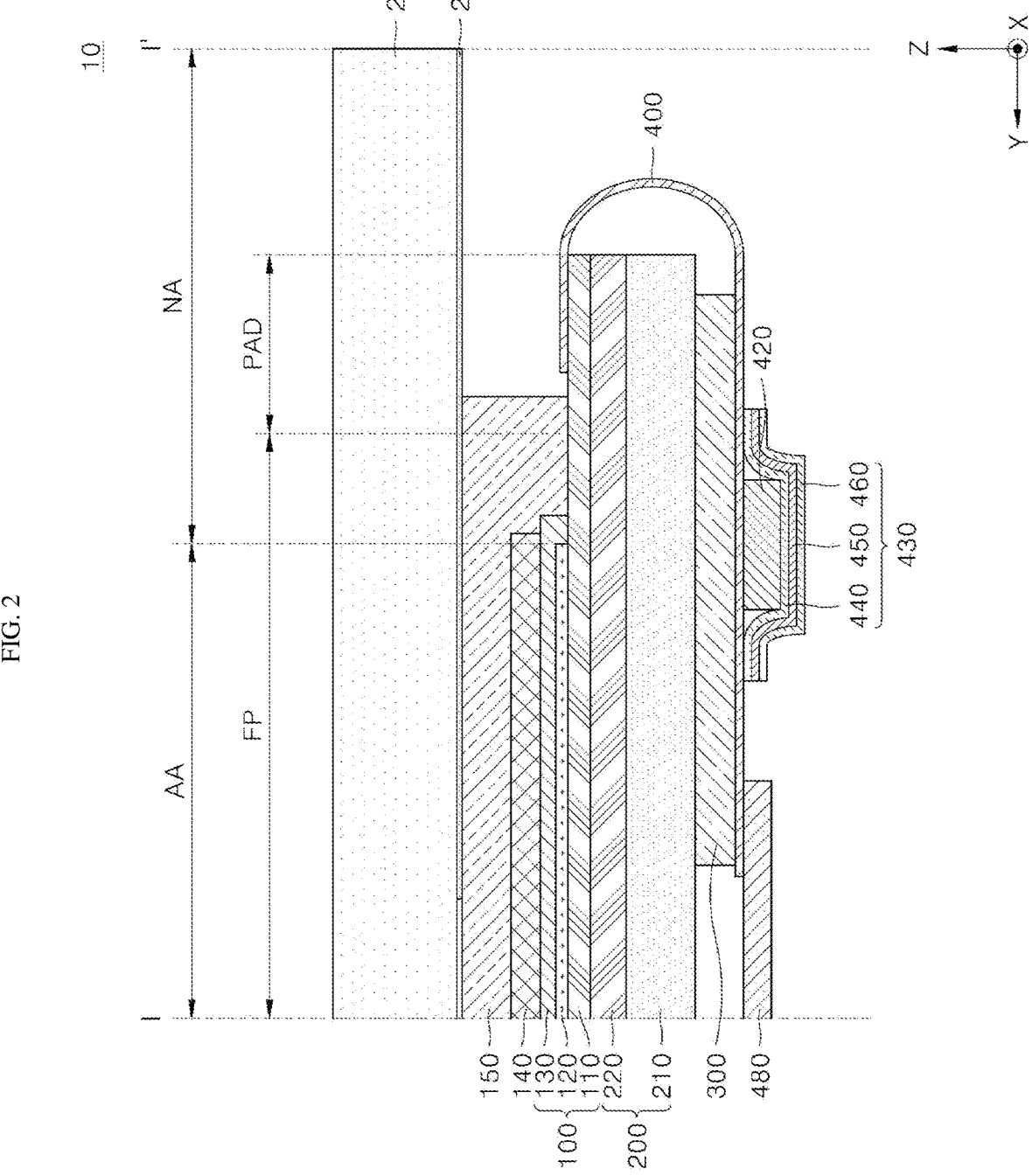
FIG. 2 is a cross-sectional view along I-I' of FIG. 1A, and shows a display apparatus according to an embodiment of the present disclosure.

FIG. 2 is a cross-sectional view along I-I' of FIG. 1A, and shows a display apparatus according to an embodiment of the present disclosure.

Referring to FIG. 2, the display panel 100 may be connected or coupled to the back surface of the cover member 20.

A first connection member 150 having adhesiveness may be disposed between the cover member 20 and the display panel 100, so that the cover member 20 and the display panel 100 may be connected or attached to each other via the first connection member 150.

Since the first connection member 150 may be disposed to overlap the display area AA, the first connection member 150 may be made of a transparent adhesive member. For example, the first connection member 150 may be made of or include a material such as OCA (Optical Clear Adhesive), OCR (Optical Clear Resin), or PSA (Pressure Sensitive Adhesive). The present disclosure is not limited thereto.

An optical film 140 may be further disposed between the first connection member 150 and the display panel 100. The optical film 140 may have a form in which one or more function layers are stacked. However, the present disclosure is not limited thereto. For example, the optical film 140 may include an anti-reflection layer such as a polarizing film that may prevent reflection of external light and improve outdoor visibility and contrast of the image displayed on the display panel 100.

Further, the optical film 140 may further include a barrier layer to prevent penetration of moisture or oxygen, in one example. The barrier layer may be made of a material with low moisture permeability, such as a polymer material.

The display panel 100 may include a substrate 110, a pixel array 120 disposed on the substrate 110, and an encapsulation portion 130 disposed to cover the pixel array 120. A touch electrode may be additionally disposed on the encapsulation portion 130.

The substrate 110 may serve as a base substrate of the display panel 100. The substrate 110 may be embodied as a glass substrate made of glass that may have a high flatness and withstand a high process temperature.

The substrate 110 is thick and heavy in a mother glass state. Thus, it is necessary to reduce a thickness and a weight thereof to improve portability.

Therefore, a surface of the substrate 110 may be etched by spraying an etchant on at least one surface of the substrate 110 or immersing the substrate 110 in the etchant. The etching may allow the thickness and the weight of the substrate 110 to be reduced.

For example, the substrate is 500 µm thick in the mother glass state. The etching of the substrate may allow the substrate 110 to have a thickness of 200 µm. When the thickness of the substrate 110 is 200 µm or smaller, the substrate may be easily damaged. Moreover, when the thickness of the substrate 110 is 200 µm or larger, the thickness and the weight increase and thus the portability may decrease.

The pixel array 120 disposed on the substrate 110 may be implemented in a form of various elements that display an image. The pixel array is not specifically limited.

The pixel array 120 may correspond to an area displaying an image toward a front surface of the cover member 20, and may correspond to the display area AA.

Accordingly, an area of the cover member 20 corresponding to the pixel array 120 may be the display area AA of the cover member, and an area other than the display area AA may be the non-display area NA of the cover member.

The pixel array 120 may include a plurality of pixels disposed in a pixel area defined by signal lines on the substrate 110 and displaying an image based on a signal supplied to the signal lines. The signal lines may include a gate line, a data line, and a pixel driving power line.

Each of the plurality of pixels may include a driving thin-film transistor, an anode electrode electrically connected to the driving thin-film transistor, a light-emitting element layer formed on the anode electrode, and a cathode electrode electrically connected to the light-emitting element layer in the pixel area.

The driving thin-film transistor may include a gate electrode, a semiconductor layer, a source electrode, and a drain electrode. The semiconductor layer of the driving thin-film transistor may include silicon such as a-Si, poly-Si, or low-temperature poly-Si, or oxide such as IGZO (Indium-Gallium-Zinc-Oxide).

The anode electrode may be disposed in each pixel area and correspond to an opening area defined according to a pattern shape of the pixel and may be electrically connected to the driving thin-film transistor.

The light-emitting element layer may include, for example, an organic light-emitting element formed on the anode electrode. Each organic light-emitting element may be implemented to emit light of the same color such as white light for different sub-pixels or to emit lights of different colors such as red, green, and blue for different sub-pixels.

The cathode electrode may be commonly connected to the light-emitting elements of the light-emitting element layer respectively provided in the pixel areas.

The encapsulation portion 130 may be formed on the substrate 110 so as to cover the pixel array 120. The encapsulation portion 130 may prevent penetration of oxygen, moisture, or a foreign material into the light-emitting element layer of the pixel array 120. For example, the encapsulation portion 130 may be formed in a multi-layer structure in which an organic material layer and an inorganic material layer are alternately stacked.

The display panel 100 may include the front portion FP and the pad portion PAD extending from the front portion FP. The plate 200 may be disposed under the front portion FP and the pad portion PAD of the display panel 100. The plate 200 may include a cushion plate, and may have a heat-dissipation function and a reinforcing function (or an impact absorption function).

When a partial area of the flexible circuit board 400 is fixed to and disposed under the plate 200, a second connection member 300 may be disposed under the plate 200. The second connection member 300 may be disposed to fix the other side of the flexible circuit board 400 having one side connected to the pad portion PAD to a bottom surface of the plate 200. One side of the flexible circuit board 400 may be connected to the pad portion PAD. The flexible circuit board 400 may be bent such that the other side thereof may be fixed to and disposed under the second connection member 300. An area occupied by the flexible circuit board 400 decreases as the flexible circuit board 400 bends sharply. Thus, a size of the display apparatus 10 may be reduced. In one embodiment, the flexible circuit board 400 may be formed of a different material from the substrate 100, and may be formed of a material that can be bent.

The plate 200, the second connection member 300, and a portion of the flexible circuit board 400 may be sequentially disposed under the display panel 100.

The plate 200 disposed under the display panel 100 may include a porous member 210 and an adhesive member 220. The porous member 210 may be embodied as a metal foam or a porous substrate.

The display panel 100 using the etched glass substrate 110 may be easily broken even with a low level of impact due to its small thickness. Further, when the high-temperature heat generated from the driver 420 is transferred to the display panel 100, the pixel array 120 disposed on the substrate 110 may be damaged and thus the screen may not operate or may malfunction.

Therefore, in the display apparatus 10 according to an embodiment of the present disclosure, the plate 200 may be directly attached or fixed to a bottom surface of the display panel 100, thereby improving the heat-dissipation and impact absorption function without increase in the thickness of the display apparatus due to an additional component.

The adhesive member 220 having a certain thickness may be stacked on one surface of the porous member 210 such that the porous member 210 may be directly attached or fixed to the display panel 100 via the adhesive member 220.

The adhesive member 220 may include an adhesive layer having a flat shape and including an adhesive component, or an adhesive layer having an embossed pattern to prevent air bubbles from being generated. The adhesive member 220 is not limited thereto, and may be made of various materials and may have various shapes.

Figure 3:
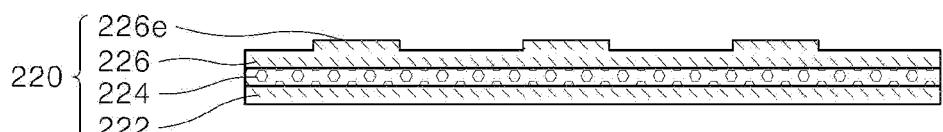
FIG. 3 is a cross-sectional view showing an adhesive member of a plate according to an embodiment of the present disclosure.

FIG. 3 is a cross-sectional view showing an adhesive member of a plate according to an embodiment of the present disclosure. FIG. 3 shows the adhesive member 220 on which the embossed pattern is formed.

The adhesive member 220 may be disposed on a top surface of the porous member 210. The adhesive member 220 may include an embossed pattern 226*e* as an unevenness structure formed on a top surface of the adhesive member 220. The embossed pattern 226*e* as the unevenness structure of the adhesive member 220 may prevent air bubbles from being generated between the porous member 210 and the display panel 100 when the porous member 210 is attached to the display panel 100.

The adhesive member 220 may be in direct contact with the display panel 100 to connect or fix the porous member 210 to the display panel 100.

The adhesive member 220 may include a base 224, and a first layer 222 and a second layer 226 respectively disposed on both vertically opposing surfaces of the base 224.

The second layer 226 of the adhesive member 220 may have a plurality of embossed patterns 226*e* such as an unevenness structure formed thereon.

At least one of the first layer 222, the second layer 226, and the embossed pattern 226*e* may be made of a material having an adhesive component. For example, all of the first layer 222, the second layer 226, and the embossed pattern 226*e* may be made of a material having an adhesive component.

The base 224 may serve to keep a shape of the adhesive member 220, and may be made of a material having constant strength and hardness to maintain the shape of the base 224. For example, the base 224 may be made of a material such as PET (polyethylene terephthalate). The present disclosure is not limited thereto.

Figure 4:
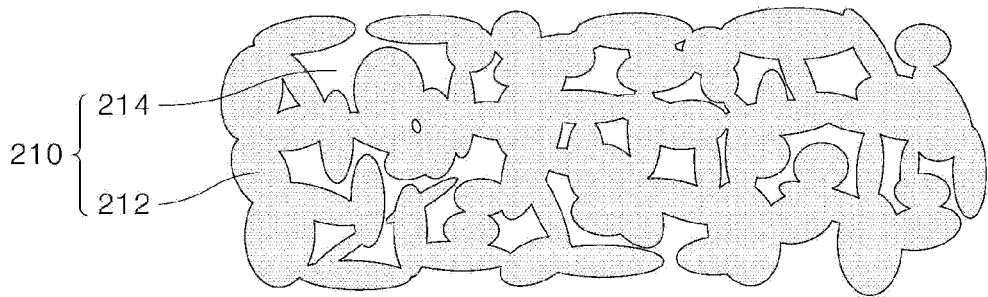
FIG. 4 is a cross-sectional view showing a porous member of a plate according to an embodiment of the present disclosure.

FIG. 4 is a cross-sectional view showing a porous member of a plate according to an embodiment of the present disclosure.

The porous member 210 may be a porous metal structure including a conductive metal 212 and a plurality of pores 214 positioned inside the conductive metal 212.

Since the conductive metal 212 of the porous member 210 is made of a metal with high thermal conductivity, the porous member 210 itself may provide an excellent heat-dissipation function. Because the porous member 210 has a metal structure with the plurality of pores 214 therein, the porous member 210 may provide an excellent cushion function.

Further, since the porous member 210 includes the conductive metal 212 including the plurality of pores 214 formed therein, an overall surface area thereof may be increased, so that the porous member 210 itself may provide an excellent heat-dissipation function.

Therefore, the plate 200 according to an embodiment of the present disclosure may effectively perform both the heat-dissipation function and the impact absorbing function at the same time only using the porous member 210 without requiring a separate heat-dissipation layer for the heat-dissipation function and a separate cushion layer for the cushion function.

Further, since there is no addition of a component to the plate, the plate may have a small thickness, thereby reducing the overall thickness of the display apparatus.

That is, the plate 200 may be directly disposed under display panel 100 to reduce thickness and the weight of the display apparatus 10.

A porosity of the porous member 210 having the plurality of pores 214 may be in a range of 50% to 76%, and a size of each pore may be in a range of 20 μm to 30 μm. When the porosity is lower than this range, the weight of the porous member 210 becomes larger, and the heat-dissipation effect may be lowered as the number of the pores decreases. Conversely, when the porosity is higher than this range, it is difficult to maintain a desired rigidity thereof.

The porous member 210 may be formed, for example, in a following manufacturing manner. The present disclosure is not limited thereto.

The porous member 210 may be formed by sintering a metal foam precursor containing a metal powder.

The metal foam precursor refers to a structure before proceeding with a process, such as the sintering, performed to form the porous member 210.

For example, the metal foam precursor may be formed using a slurry containing a metal powder, a dispersant, and a binder.

The metal powder may be a metal powder in which one or more metal powders or a powder of an alloy of one or more metals among a copper powder, a nickel powder, an iron powder, a SUS powder, a molybdenum powder, a silver powder, a platinum powder, a gold powder, an aluminum powder, a chromium powder, an indium powder, a tin powder, a magnesium powder, a phosphorus powder, a zinc powder, and a manganese powder are mixed, but may not be limited thereto.

The dispersant may, for example, use alcohol, but may not be limited thereto.

In this case, the alcohol may use monohydric alcohol having 1 to 20 carbon atoms, such as methanol, ethanol, propanol, pentanol, octanol, ethylene glycol, propylene glycol, pentanol, 2-methoxyethanol, 2-ethoxyethanol, 2-butoxyethanol, glycerol, texanol, or terpineol, dihydric alcohol having 1 to 20 carbon atoms, such as ethylene glycol, propylene glycol, hexanediol, octanediol, or pentanediol, or polyhydric alcohol, but may not be limited thereto.

A type of binder may not be particularly limited, and may be selected based on a type of the metal component or the dispersant used in preparing the slurry.

For example, the binder may use alkyl cellulose having an alkyl group having 1 to 8 carbon atoms, such as methyl cellulose or ethyl cellulose, polyalkylene carbonate having an alkylene unit having 1 to 8 carbon atoms, such as polypropylene carbonate or polyethylene carbonate, or a polyvinyl alcohol-based binder, such as polyvinyl alcohol or polyvinyl acetate, but may not be limited thereto.

After forming the slurry to contain the metal powder, the dispersant, and the binder as described above, the slurry may be injected into a mold having a predetermined shape or coated on a substrate to form the metal foam precursor.

The metal foam precursor thus formed may be formed into the porous member 210 via the sintering process.

In this case, conditions of the sintering process are not particularly limited as long as the sintering is performed at a temperature and for a time of levels at which a solvent contained in the slurry may be removed to a desired level. For example, the sintering may be performed in a temperature range of about 50° C. to 250° C. for a predetermined time, but the present disclosure may not be limited thereto.

The plate 200 may be formed by forming the porous member 210 and then attaching the adhesive member 220 to one surface of the porous member 210.

Alternatively, the metal foam precursor may be formed on the adhesive member 220 and may be sintered to form the porous member 210 and the plate 200. A scheme of manufacturing the plate 200 is not particularly limited.

Referring to FIG. 2, the flexible circuit board 400 on which the driver 420 has been mounted may be bent so as to be disposed under the plate 200 and to be fixed thereto via the second connection member 300. The driver 420 of the flexible circuit board 400 may be disposed under the plate 200.

For example, the second connection member 300 may be embodied as a double-sided tape having adhesive strength by which the tape may fix the second plate 220 and the porous member 210 to each other. The present disclosure is not limited thereto. The second connection member 300 may be embodied as a foam tape or a foam pad with adhesive strength and thus may have an effect of mitigating the impact.

The driver 420 may be mounted on the other side of the flexible circuit board 400 disposed under the second connection member 300. The driver 420 may output an image signal to drive the pixel. An area of the display panel 100 to which the signal output from the driver 420 is applied is increasingly larger and a fast driving speed is required. Thus, to the driver 420 has to process and apply a large number of data within a short time. In this process, the driver 420 may generate high temperature heat.

Since the high-temperature heat generated from the driver 420 shortens the life of the driver 420 or causes malfunction, a shielding member 430 may be disposed to heat-dissipate the high-temperature heat generated from the driver 420.

The shielding member 430 may include a first insulating layer 440, a conductive layer 450, and a second insulating layer 460. The shielding member 430 may be made of a flexible material, and may include an adhesive component on a surface of the first insulating layer 440, and thus may be attached to the driver 420 so as to cover the driver 420.

The first insulating layer 440 of the shielding member 430 refers to a portion in direct contact with the driver 420, and may be made of a material that is electrically insulated without damaging the driver 420.

For example, the first insulating layer 440 may be made of flexible polyimide, flexible PET (polyethylene terephthalate), flexible polyethylene naphthalate (PEN), etc. The present disclosure is not limited thereto.

The conductive layer 450 may be made of a metal layer including at least one of copper (Cu), silver (Ag), aluminum (Al), iron (Fe), nickel (Ni), graphite, and tungsten (W) with excellent thermal conductivity to effectively dissipate the high-temperature heat generated from the driver 420.

Alternatively, the conductive layer 450 may be formed by mixing powders of at least one of copper (Cu), silver (Ag), aluminum (Al), iron (Fe), nickel (Ni), graphite and tungsten (W) having excellent thermal conductivity with a resin composition such as epoxy or acryl.

The second insulating layer 460 may be made of the same material as that of the first insulating layer 440, and may be formed to protect the driver 420 from external impact and to seal the conductive layer 450.

Each of the first insulating layer 440 and the second insulating layer 460 may be made of a black material to shield the external light. The driver 420 may be a kind of an integrated circuit (IC). When the driver 420 is exposed to the external light, defects and malfunctions may occur therein. Accordingly, each of the first insulating layer 440 and the second insulating layer 460 may be made of a black material so that external light incident to the driver 420 is absorbed by the first insulating layer 440 and the second insulating layer 460.

For example, each of the first insulating layer 440 and the second insulating layer 460 may include carbon black or graphite, or may be formed by coating carbon black or graphite powders. The graphite may have high thermal conductivity and may also have a heat-dissipation effect. A material and a manufacturing scheme of each of the first insulating layer 440 and the second insulating layer 460 are not limited thereto, and may be variously modified.

A printed circuit board 480 may be connected to the other side end of the flexible circuit board 400. A timing controller, a power supply, and a gamma voltage generator that first process various signal information input from an external device to generate a signal voltage necessary for image rendering may be mounted on the printed circuit board 480.

The driver 420 may output an image signal to the data line, the gate line, and the power line of the display panel 100 via a signal voltage transmitted from the printed circuit board 480.

Figure 5:
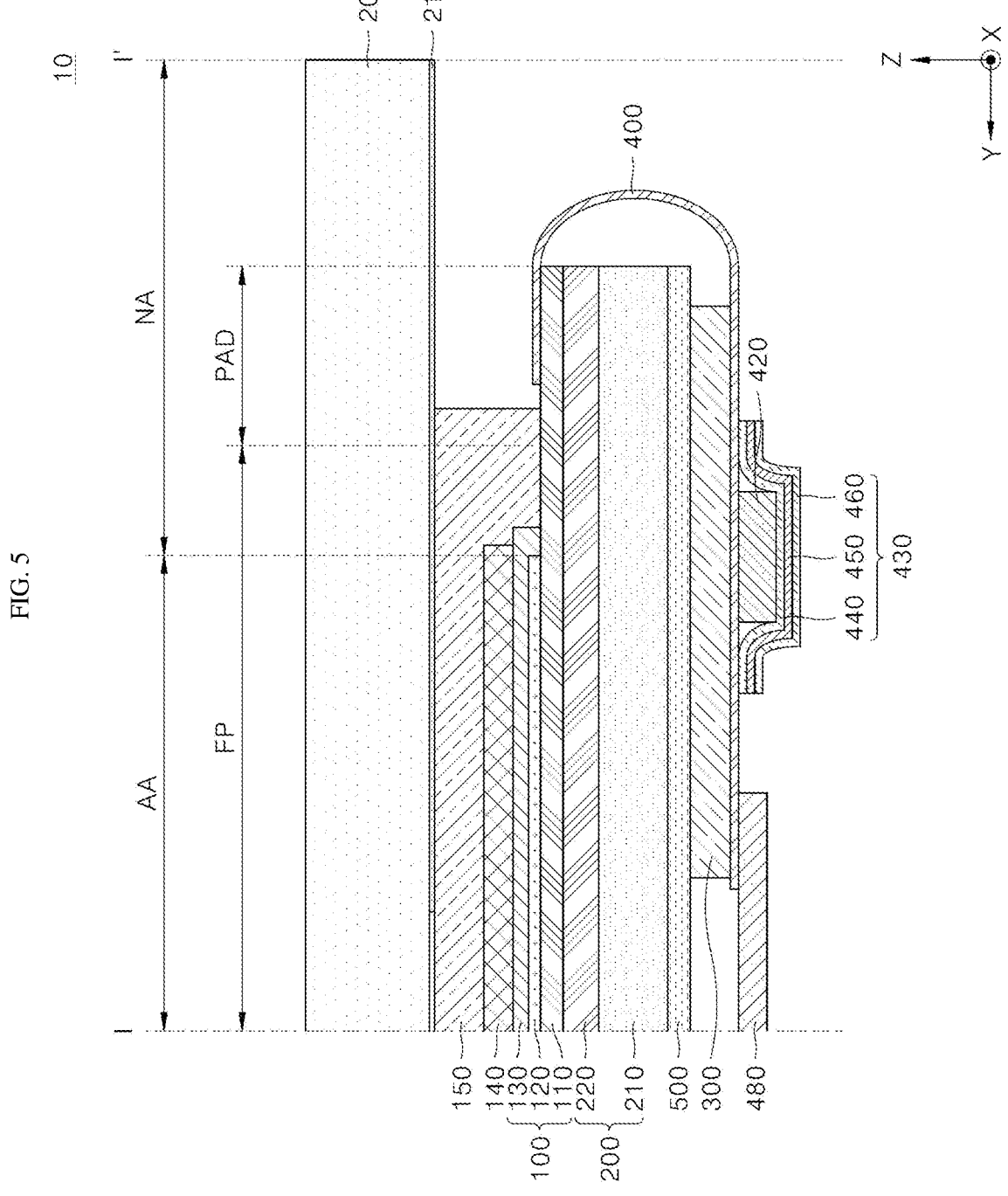
FIG. 5 is a cross-sectional view along I-I' of FIG. 1A and shows a display apparatus according to another embodiment of the present disclosure.

FIG. 5 is a cross-sectional view along I-I' of FIG. 1A and shows a display apparatus according to another embodiment of the present disclosure.

Referring to FIG. 5, a first heat-dissipation layer 500 may be disposed between the plate 200 and the second connection member 300. The first heat-dissipation layer 500 may be attached to a bottom surface of the porous member 210 or formed integrally with the porous member 210.

The first heat-dissipation layer 500 may include a material with high thermal conductivity. For example, the first heat-dissipation layer 500 may include a metal having high thermal conductivity such as copper (Cu) and aluminum (Al), or graphite, and the like. The present disclosure is not limited thereto. Further, since the first heat-dissipation layer 500 is conductive, the first heat-dissipation layer 500 may have a grounding function and a function of protecting the back surface of the porous member 210 together with the heat-dissipation function.

The first heat-dissipation layer 500 may be in contact with the porous member 210 so as to transfer heat generated from the driver 420 to the porous member 210 to improve the heat-dissipation effect.

Further, the first heat-dissipation layer 500 may directly radiate the high-temperature heat generated from the driver 420 to lower the temperature thereof.

The first heat-dissipation layer 500 may be connected or fixed to the bottom surface of the plate 200 using an adhesive or the like.

Alternatively, the first heat-dissipation layer 500 may be integrally formed with and disposed under the porous member 210.

For example, when the porous member 210 is formed on a top surface of the first heat-dissipation layer 500, the porous member 210 and the first heat-dissipation layer 500 may be integrally formed with each other. In order to integrally form the porous member 210 and the first heat-dissipation layer 500 so as to be monolithic with each other, a metal foam precursor including metal powders may be disposed on the first heat-dissipation layer 500, and then, the metal foam precursor may be sintered to form an integrated or monolithic structure between the first heat-dissipation layer 500 and the porous member 210.

Moreover, the adhesive member 220 may be placed on the porous member 210 and then the display panel 100 may be placed on the adhesive member 220. In this manner, the display apparatus 10 may be formed.

The flexible circuit board 400 on which the driver 420 has been mounted and the second connection member 300 for connecting or fixing the flexible circuit board 400 to the first heat-dissipation layer 500 may be disposed under the first heat-dissipation layer 500. Thus, the high-temperature heat generated from the driver 420 and then flowing upwardly may be dissipated via the first heat-dissipation layer 500 and the porous member 210. Thus, the temperature of the driver 420 may be lowered.

The shielding member 430 may be disposed on a bottom surface and a side surface of the driver 420. Thus, the heat generated from the driver 420 and flowing toward the bottom surface and the side surface thereof may be dissipated via the shielding member 430. The shielding member 430 may be attached and fixed to the driver 420 so as to cover the driver 420.

Figure 6:
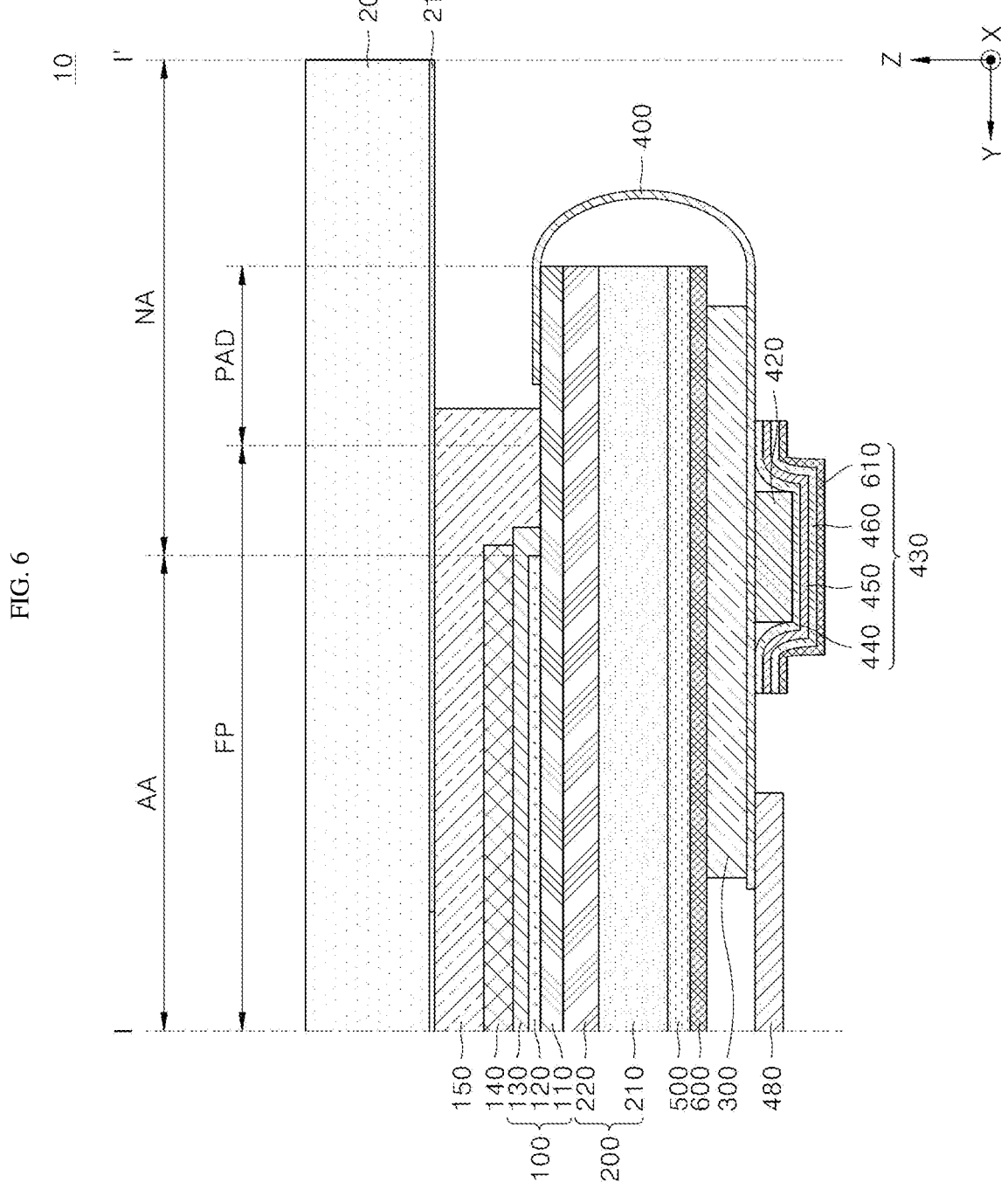
FIG. 6 is a cross-sectional view along I-I' of FIG. 1A, and shows a display apparatus according to still another embodiment of the present disclosure.

FIG. 6 is a cross-sectional view along I-I' of FIG. 1A, and shows a display apparatus according to still another embodiment of the present disclosure.

Referring to FIG. 6, a second heat-dissipation layer 600 may be disposed under the first heat-dissipation layer 500, such that the heat-dissipation function may be further improved. That is, the second heat-dissipation layer 600 may be disposed between the first heat-dissipation layer 500 and the second connection member 300. The plate 200, the first heat-dissipation layer 500, the second heat-dissipation layer 600, the second connection member 300, and the flexible circuit board 400 on which the driver 420 has been mounted may be sequentially stacked and disposed under the display panel 100.

The second heat-dissipation layer 600 may be formed by applying a heat-dissipation resin on the first heat-dissipation layer 500. The second heat-dissipation layer 600 may be embodied as a coating layer which improves heat-dissipation performance.

The second heat-dissipation layer 600 may be formed by mixing high thermal conductivity metal, carbon, graphite, etc. with resin to form a heat-dissipation resin, and then applying the heat-dissipation resin to a surface of the first heat-dissipation layer 500 and then curing the heat-dissipation resin.

For example, the heat-dissipation resin may be formed by mixing at least one of silicone, epoxy, urethane, and acryl with at least one of aluminum (Al), molybdenum (Mo), chromium (Cr), titanium (Ti), nickel (Ni), neodymium (Nd), copper (Cu), silver (Ag), magnesium (Mg), carbon or graphite. The present disclosure is not limited thereto.

Alternatively, the second heat-dissipation layer 600 may be formed by applying an adhesive layer on a bottom surface of the first heat-dissipation layer 500, and then spraying powders including carbon or graphite on the adhesive layer, and then sealing the powders with polyimide, PET (polyethylene terephthalate), etc.

The second heat-dissipation layer 600 may be disposed on a bottom surface of the plate 200 so as to improve the heat-dissipation performance of the porous member 210. The second heat-dissipation layer 600 may be formed in a scheme of applying the heat-dissipation resin to the bottom surface of the porous member 210.

When the second heat-dissipation layer 600 is formed to have a black color, the external light incident on the display panel 100 may be absorbed by the second heat-dissipation layer 600. Thus, a black screen may be displayed while the display panel 100 is not activated.

The optical film 140 may be disposed on the display panel 100. However, the optical film 140 prevents reflection of the external light by polarizing (or circularly polarizing) the external light. Thus, the optical film 140 may not prevent reflection of an entirety of incident light. Thus, it may be difficult to display the black screen while the display panel 100 is not activated.

Therefore, the second heat-dissipation layer 600 with a black color may be formed under the porous member 210 of the plate 200 disposed under the display panel 100 so as to absorb the external light incident on the display panel 100. Thus, while the display panel 100 is not activated, the black screen may be displayed. Accordingly, a boundary with a light-blocking portion 21 surrounding the display panel 100 may be not recognized, and thus the display quality may be improved.

A radiating coated layer 610 may be formed to a surface of the shielding member 430 disposed under the driver 420 by applying the heat-dissipation resin to the surface of the shielding member 430 disposed under the driver 420 in the same manner as a manner in which the second heat-dissipation layer 600 is formed. Accordingly, the radiating coated layer 610 may be made of the same material as that of the second heat-dissipation layer 600.

The radiating coated layer 610 may be formed on a top surface or a bottom surface of the shielding member 430. The radiating coated layer 610 may be formed by attaching the shielding member 430 to the driver 420 and then applying the heat-dissipation resin to the bottom surface of the shielding member 430.

When the radiating coated layer 610 contains carbon or graphite and thus has a black color, the radiating coated layer 610 may shield the driver 420 from the external light.

The radiating coated layer 610 may be formed by applying an adhesive layer on a bottom surface of the first heat-dissipation layer 500, and then spraying powders including carbon or graphite on the adhesive layer, and then sealing the powders with polyimide, PET (polyethylene terephthalate), etc.

Even when the display apparatus according to an embodiment of the present disclosure include the glass substrate which is thick and has poor strength, the thickness of the display apparatus may be reduced and the strength and the heat-dissipation function may be enhanced due to the thin plate disposed under the substrate and having greater strength or excellent impact absorption function, and excellent heat-dissipation function.

According to an embodiment of the present disclosure a display apparatus comprise a display panel including a front portion for displaying an image, and a pad portion extending from the front portion, and a plate in contact with a bottom surface of the front portion, wherein the plate includes a porous member and an adhesive member positioned on a top surface of the porous member.

In some embodiments of the display apparatus, the display panel further includes a substrate and a pixel array disposed on a front surface of the substrate, wherein the substrate includes a glass substrate.

In some embodiments of the display apparatus, the display apparatus further comprises a first heat-dissipation layer in contact with a bottom surface of the plate.

In some embodiments of the display apparatus, the display apparatus further comprises a second heat-dissipation layer disposed on a bottom surface of the first heat-dissipation layer.

In some embodiments of the display apparatus, the display apparatus further comprises a second heat-dissipation layer disposed on a bottom surface of the plate.

In some embodiments of the display apparatus, the second heat-dissipation layer has a black color.

In some embodiments of the display apparatus, the display apparatus further comprises a flexible circuit board connected to the pad portion, wherein a driver is mounted on the flexible circuit board, wherein the flexible circuit board is bent so that the driver is disposed under the plate.

In some embodiments of the display apparatus, the display apparatus further comprises a shielding member covering the driver, wherein a radiating coated layer is disposed on a surface of the shielding member.

In some embodiments of the display apparatus, the radiating coated layer is made of the same material as a material of the second heat-dissipation layer.

According to an embodiment of the present disclosure a method for manufacturing a display apparatus comprises providing a first heat-dissipation layer, placing a metal foam precursor containing metal powders on a top surface of the first heat-dissipation layer, sintering the metal foam precursor to form a porous member adhered to the first heat-dissipation layer, placing an adhesive layer on the porous member, and placing a display panel on the adhesive layer.

In some embodiments of the method, the method further comprises applying a heat-dissipation resin onto a bottom surface of the first heat-dissipation layer, and curing the heat-dissipation resin such that a second heat-dissipation layer is formed on the bottom surface of the first heat-dissipation layer.

In some embodiments of the method, the heat-dissipation resin includes a mixture of at least one of silicone, epoxy, urethane, or acryl, and at least one of aluminum (Al), molybdenum (Mo), chromium (Cr), titanium (Ti), nickel (Ni), neodymium (Nd), copper (Cu), silver (Ag), magnesium (Mg), carbon or graphite.

A scope of protection of the present disclosure should be construed by the scope of the claims, and all technical ideas within the scope equivalent thereto should be construed as being included in the scope of the present disclosure. Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A display apparatus comprising:
a display panel including a front portion for displaying an image, and a pad portion extending from the front portion;
a plate in contact with a bottom surface of the front portion of the display panel;
a first heat-dissipation layer in contact with a bottom surface of the plate;
a second heat-dissipation layer disposed on a bottom surface of the first heat-dissipation layer;
a driver is disposed under the plate; and
a shielding member covering the driver,

wherein the plate includes a porous member and an adhesive member positioned on a top surface of the porous member, and
wherein the second heat-dissipation layer includes a combination of a thermally conductive material and resin.

2. The display apparatus of claim 1, wherein the display panel further includes a substrate and a pixel array disposed on a front surface of the substrate, wherein the substrate includes a glass substrate.

3. The display apparatus of claim 1, wherein the second heat-dissipation layer has a black color.

4. The display apparatus of claim 1, further comprising a flexible circuit board connected to the pad portion, wherein the driver is mounted on the flexible circuit board,
wherein the flexible circuit board is bent so that the driver is disposed under the plate.

5. The display apparatus of claim 1, further comprising a radiating coated layer disposed on a surface of the shielding member.

6. The display apparatus of claim 5, wherein the radiating coated layer is made of the same material as a material of the second heat-dissipation layer.

7. A method for manufacturing a display apparatus, the method comprising:
providing a first heat-dissipation layer;
placing a metal foam precursor containing metal powders on a top surface of the first heat-dissipation layer;
sintering the metal foam precursor to form a porous member adhered to the first heat-dissipation layer;
placing an adhesive layer on the porous member; and
placing a display panel on the adhesive layer.

8. The method of claim 7, further comprising: applying a heat-dissipation resin onto a bottom surface of the first heat-dissipation layer, and curing the heat-dissipation resin such that a second heat-dissipation layer is formed on the bottom surface of the first heat-dissipation layer.

9. The method of claim 8, wherein the heat-dissipation resin includes a mixture of at least one of silicone, epoxy, urethane, or acryl, and at least one of aluminum (Al), molybdenum (Mo), chromium (Cr), titanium (Ti), nickel (Ni), neodymium (Nd), copper (Cu), silver (Ag), magnesium (Mg), carbon or graphite.

10. A display apparatus comprising:
a display panel including:
a substrate including glass; and
a pixel array for displaying an image, the pixel array disposed on the substrate; and
a plate disposed below the display panel, the plate including:
a porous member including a metal structure formed with a plurality of pores; and
an adhesive member on a top surface of the porous member,
a first heat-dissipation layer disposed below the plate, the first heat-dissipation layer formed of a metal material; and
a second heat-dissipation layer disposed below the first heat-dissipation layer, the second heat-dissipation layer including a combination of a thermally conductive material and resin.

11. The display apparatus of claim 10, further comprising a flexible circuit board on which a driver has been mounted, wherein one side of the flexible is attached to a pad portion of the display panel, and wherein the flexible circuit board is bent such that the driver is disposed under the plate.

12. The display apparatus of claim 11, further comprising a shielding member disposed on the driver, the shielding member including at least a conductive layer.

13. The display apparatus of claim 11, further comprising a connection member disposed between the flexible circuit board and the plate.

14. The display apparatus of claim 10, wherein the plate directly contacts a bottom surface of the display panel.

15. The display apparatus of claim 10, further comprising:

a flexible circuit board on which a driver has been mounted, wherein one side of the flexible is attached to a pad portion of the display panel, and wherein the flexible circuit board is bent such that the driver is disposed under the plate; and a coated layer disposed on the driver, wherein the coated layer is formed of a same material as the second heat-dissipation layer.

\* \* \* \* \*